United States Patent
Sotome et al.

(10) Patent No.: US 9,881,650 B1
(45) Date of Patent: Jan. 30, 2018

(54) CONNECTOR MITIGATING CROSSTALK FOR HIGH SPEED COMMUNICATION

(71) Applicant: Western Digital Technologies, Inc., Irvine, CA (US)

(72) Inventors: Akihiro Sotome, Fujisawa (JP); Satoshi Nakamura, Yokohama (JP); Masayuki Mabe, Fujisawa (JP); Takayuki Imai, Toyonaka (JP)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/390,566

(22) Filed: Dec. 26, 2016

(51) Int. Cl.
| | | |
|---|---|---|
| *H01R 12/70* | (2011.01) | |
| *G11B 33/12* | (2006.01) | |
| *H05K 1/02* | (2006.01) | |
| *H05K 1/11* | (2006.01) | |
| *H01R 12/71* | (2011.01) | |
| *H01R 13/6461* | (2011.01) | |

(52) U.S. Cl.
CPC ....... *G11B 33/122* (2013.01); *H01R 12/7076* (2013.01); *H01R 12/716* (2013.01); *H01R 13/6461* (2013.01); *H05K 1/0215* (2013.01); *H05K 1/0216* (2013.01); *H05K 1/117* (2013.01)

(58) Field of Classification Search
CPC H05K 1/0216; G11B 33/122; H01R 13/6461; H01R 13/6471; H01R 13/6585; H01R 13/6586; H01R 13/6587; H01R 13/6597
See application file for complete search history.

(56) References Cited

U.S. PATENT DOCUMENTS

| | | | | | |
|---|---|---|---|---|---|
| 5,807,137 | A | * | 9/1998 | Janota | H01R 13/65802 439/607.33 |
| 6,036,506 | A | * | 3/2000 | Korsunsky | H01R 23/6873 439/637 |
| 7,011,533 | B2 | * | 3/2006 | Miyamoto | H01R 13/65802 439/108 |
| 7,131,874 | B2 | * | 11/2006 | Kuroda | H01R 13/65802 439/108 |

(Continued)

OTHER PUBLICATIONS

Molex; Micro Serial Attached SCSi (Micro SAS) Connectors; dated 2010; 5 total pages.

(Continued)

*Primary Examiner* — Ross Gushi
(74) *Attorney, Agent, or Firm* — Patterson + Sheridan, LLP

(57) ABSTRACT

The present disclosure generally relates to a connector structure that prevents crosstalk in devices such as electronic and data storage devices. The connector structure is disposed in a different plane than the signal lines, but is connected to ground lines that are disposed in the same plane as the signal lines. The connector structure has a beam portion for each ground line. Additionally, there is a backbone portion that connects all of the beam portions. The beam portions are coupled to the ground lines by a ground bar. The ground bar can have a width that is equal to the width of the ground line. Additionally, the connection point between the ground line and the ground bar can be sloped, and the ground line and ground bar can be parallel to each other at the connection point. The connector structure prevents crosstalk between the signal lines.

24 Claims, 5 Drawing Sheets

(56) References Cited

U.S. PATENT DOCUMENTS

| | | | | |
|---|---|---|---|---|
| 7,377,812 | B2* | 5/2008 | Fukushima | H01R 12/716 439/607.01 |
| 7,909,648 | B2* | 3/2011 | Tai | H01R 13/65802 439/607.32 |
| 8,262,411 | B2* | 9/2012 | Kondo | H01R 13/6658 439/607.01 |
| 8,694,709 | B2 | 4/2014 | Loffink | |
| 8,702,451 | B2* | 4/2014 | Luo | H01R 12/725 439/607.28 |
| 8,764,460 | B2* | 7/2014 | Smink | H01R 13/6597 439/92 |
| 8,764,464 | B2* | 7/2014 | Buck | H01R 13/514 439/108 |
| 8,858,243 | B2* | 10/2014 | Luo | H01R 13/652 439/108 |
| 8,864,506 | B2* | 10/2014 | Little | H01R 13/6585 439/108 |
| 8,944,849 | B1* | 2/2015 | Yang | H01R 13/6471 439/607.07 |
| 9,178,319 | B2* | 11/2015 | Little | H01R 13/6585 |
| 9,276,342 | B2* | 3/2016 | Masubuchi | H01R 12/775 |
| 9,277,649 | B2 | 3/2016 | Ellison | |
| 9,337,585 | B1* | 5/2016 | Yang | H01R 13/6583 |
| 9,385,482 | B2* | 7/2016 | Li | H01R 13/6585 |
| 9,401,570 | B2* | 7/2016 | Phillips | H01R 13/6585 |
| 9,431,768 | B1* | 8/2016 | Champion | H01R 13/6471 |
| 9,455,530 | B2* | 9/2016 | Patel | H01R 13/652 |
| 9,490,585 | B2* | 11/2016 | Yang | H01R 13/6585 |
| 9,520,680 | B2* | 12/2016 | Hsu | H01R 13/658 |
| 9,634,437 | B2* | 4/2017 | Kao | H01R 13/6596 |
| 9,640,915 | B2* | 5/2017 | Phillips | H01R 13/6471 |
| 2012/0315796 | A1* | 12/2012 | Pang | H01R 13/6471 439/626 |
| 2013/0149882 | A1 | 6/2013 | Luo et al. | |
| 2013/0288513 | A1 | 10/2013 | Masubuchi et al. | |
| 2016/0020558 | A1 | 1/2016 | Yang | |
| 2016/0043511 | A1* | 2/2016 | Hsu | H01R 13/6585 439/607.05 |

OTHER PUBLICATIONS

International Search Report and Written Opinion for PCT/US2017/047421 dated Oct. 13, 2017.

* cited by examiner

CONNECTOR MITIGATING CROSSTALK FOR HIGH SPEED COMMUNICATION

BACKGROUND OF THE DISCLOSURE

Field of the Disclosure

Embodiments of the present disclosure generally relate to a connector structure that prevents crosstalk in devices such as electronic and data storage devices.

Description of the Related Art

The latest generation of hard disk drives (HDDs) and other data storage mediums utilize printed circuit boards (PCBs) outside of the storage mediums with silicon on chip (SoC) technology. Traces are used to run the electrical current from the SoC to the edge of the PCB. At the edge of the PCB, a connector structure is present to connect the storage medium to a host device such as a computing device. The connector structure has signal lines that emit an electromagnetic field when in operation.

The electromagnetic field of a signal line changes when a transmitting signal is changed electrically on the signal line and thus interferes with neighbor signal lines. The interference is referred to as crosstalk, and crosstalk can attenuate the signal that is transmitted on the interfered signal line. If the signal attenuation is too large, the signal cannot be transmitted correctly and a communication error will occur.

Higher communication speeds lead to larger crosstalk interference. To achieve higher communication speeds, signal change times have to be shorter. If the signal change time is reduced, then the electromagnetic field changes occur for a shorter period of time and the electric interference of the crosstalk increases. Thus, higher communication speeds lead to more crosstalk.

Therefore, there is a need in the art to reduce crosstalk on connector devices in electronic and data storage devices.

SUMMARY OF THE DISCLOSURE

The present disclosure generally relates to a connector structure that prevents crosstalk in devices such as electronic and data storage devices. The connector structure is disposed in a different plane than the signal lines, but is connected to ground lines that are disposed in the same plane as the signal lines. The connector structure has a beam portion for each ground line. Additionally, there is a backbone portion that connects all of the beam portions. The beam portions are coupled to the ground lines by a ground bar. The ground bar can have a width that is equal to the width of the ground line. Additionally, the connection point between the ground line and the ground bar can be sloped, and the ground line and ground bar can be parallel to each other at the connection point. The connector structure prevents crosstalk between the signal lines.

In one embodiment, a device comprises a printed circuit board and a connector structure coupled to the printed circuit board. The connector structure comprises a plurality of signal lines; a plurality of ground lines; and a grounding structure coupled to the plurality of ground lines. The grounding structure includes: a first beam portion disposed in a separate plane from the plurality of ground lines; a second beam portion disposed in the separate plane; a backbone portion, wherein the first beam portion and the second beam portion are coupled to the backbone portion; and a first ground bar coupled to both the first beam portion and a first ground line of the plurality of ground lines, wherein the first ground line and the first ground bar have a substantially equal width.

In another embodiment, a device comprises a printed circuit board and a connector structure coupled to the printed circuit board. The connector structure comprises a plurality of signal lines; a plurality of ground lines; and a grounding structure coupled to the plurality of ground lines. The grounding structure includes a first beam portion disposed in a separate plane from the plurality of ground lines; a second beam portion disposed in the separate plane; a backbone portion, wherein the first beam portion and the second beam portion are coupled to the backbone portion; and a first ground bar coupled to both the first beam portion and a first ground line of the plurality of ground lines, wherein the first ground line has a first ground line contact portion, wherein the first ground bar has a first ground bar contact portion, and wherein the first ground line contact portion is parallel to the first ground bar contact portion.

In one embodiment, a connector structure comprises a plurality of signal lines; a plurality of ground lines; and a grounding structure coupled to the plurality of ground lines. The grounding structure includes: a first beam portion disposed in a separate plane from the plurality of ground lines; a second beam portion disposed in the separate plane; a backbone portion, wherein the first beam portion and the second beam portion are coupled to the backbone portion; and a first ground bar coupled to both the first beam portion and a first ground line of the plurality of ground lines, wherein the first ground line and the first ground bar have a substantially equal width.

In another embodiment, a connector structure comprises a plurality of signal lines; a plurality of ground lines; and a grounding structure coupled to the plurality of ground lines. The grounding structure includes a first beam portion disposed in a separate plane from the plurality of ground lines; a second beam portion disposed in the separate plane; a backbone portion, wherein the first beam portion and the second beam portion are coupled to the backbone portion; and a first ground bar coupled to both the first beam portion and a first ground line of the plurality of ground lines, wherein the first ground line has a first ground line contact portion, wherein the first ground bar has a first ground bar contact portion, and wherein the first ground line contact portion is parallel to the first ground bar contact portion.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a connector structure that prevents crosstalk in devices, such as data storage devices. The connector structure is disposed in a different plane than the signal lines, but is connected to ground lines that are disposed in the same plane as the signal lines. The connector structure has a beam portion for each ground line. Additionally, there is a backbone portion that connects all of the beam portions. The beam portions are coupled to the ground lines by a ground bar. The ground bar can have a width that is equal to the width of the ground line. Additionally, the connection point between the ground line and the ground bar can be sloped, and the ground line and ground bar can be parallel to each other at the connection point. The connector structure prevents crosstalk between the signal lines.

Figure 1:
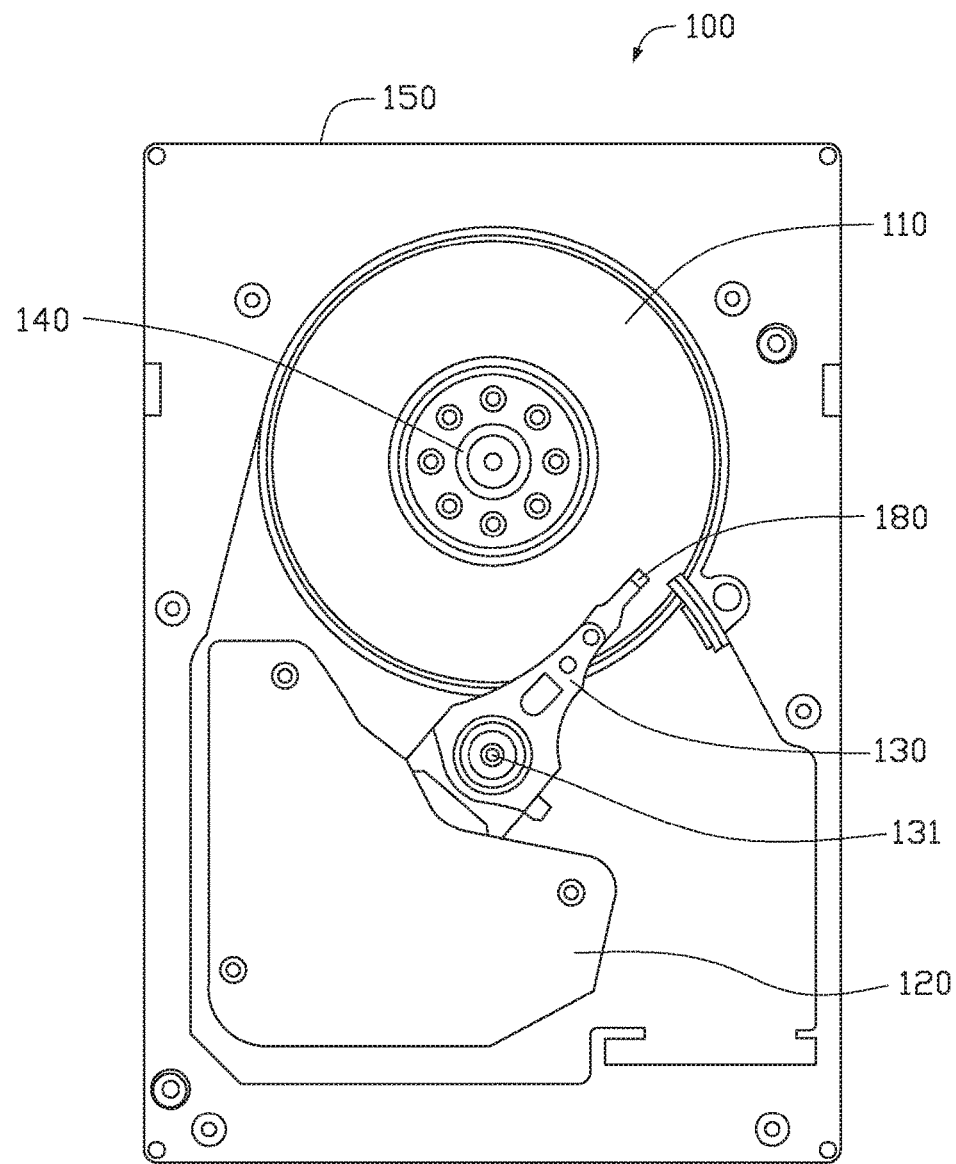
FIG. 1 is a schematic top illustration of a HDD.

FIG. 1 illustrates a top view of an exemplary data storage device 100 such as a HDD, according to an embodiment of the invention. It is to be understood that the connector device disclosed herein is not limited to HDDs, but rather, the connector device may be used as a connector for any data storage device. Additionally, the connector structure is not to be limited to data storage devices, but rather, the connector device may be used as a connector in any electronic device that utilizes signal lines. For example, the connector structure may be utilized in SSD as well as any card or device or PCB that connects to a host device.

As illustrated in FIG. 1, the data storage device 100 may include one or more magnetic media, or disks 110, actuator 120, actuator arms 130 associated with each of the magnetic disks 110, and spindle motor 140 affixed in a chassis 150. The one or more magnetic disks 110 may be arranged vertically as illustrated in FIG. 1. Moreover, the one or more magnetic disks may be coupled with the spindle motor 140.

Magnetic disks 110 may include circular tracks of data on both the top and bottom surfaces of the disk. A magnetic head 180 mounted on a slider may be positioned on a track. As each disk spins, data may be written on and/or read from the data track. Magnetic head 180 may be coupled to an actuator arm 130 as illustrated in FIG. 1. Actuator arm 130 may be configured to swivel around actuator axis 131 to place magnetic head 180 on a particular data track.

Figure 2:
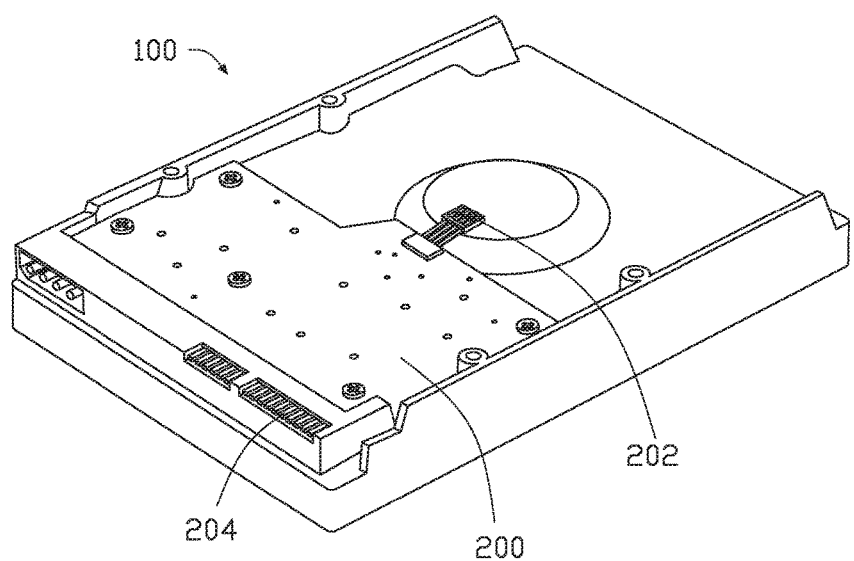
FIG. 2 is a schematic bottom illustration of a HDD including a PCB.

FIG. 2 is a schematic bottom illustration of data storage device 100 including a PCB 200. The PCB 200 has electrical connections 202 to the data storage device 100 and a connector device 204 to be used to connect to a host device, such as a computer, in which the data storage device 100 is to be placed.

Figure 3A:
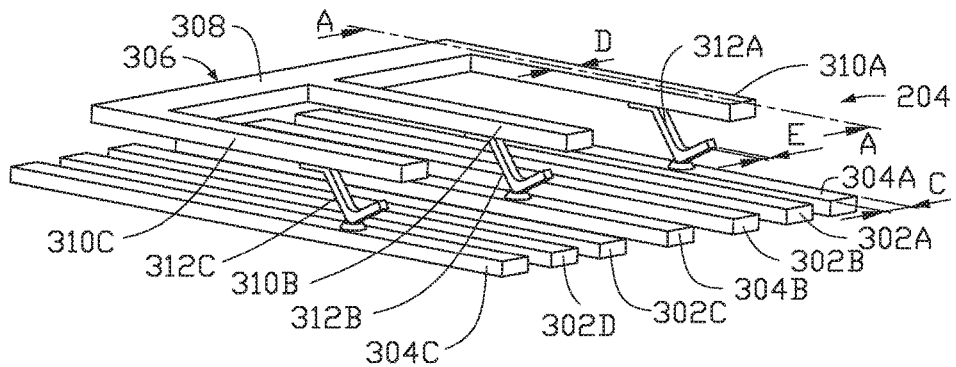
FIG. 3A is a schematic top illustration of a connector device 204.

FIG. 3A is a schematic top illustration of a connector device 204. The connector device 204 includes a plurality of signal lines 302A-302D. The signal lines 302A-302D are set up in pairs (302A-302B, 302C-302D) so that one signal line 302A-302D of each pair sends a signal from the data storage device 100 and the other signal line 302A-302D of each pair receives a signal sent to the data storage device 100. Ground lines 304A-304C are also present. The ground lines 304A-304C surround each signal line 302A-302B pair. For example, in FIG. 3A, ground lines 304A, 304B are disposed adjacent to the signal line pair 302A-302B. Similarly, ground lines 304B, 304C are disposed adjacent signal line pair 302C-302D. More specifically, ground line 304A is disposed adjacent to signal line 302A, signal line 302A is disposed adjacent to signal line 302B, and signal line 302B is disposed adjacent ground line 304B. Additionally, ground line 304B is disposed adjacent signal line 302C, signal line 302C is disposed adjacent signal line 302D, and signal line 302D is disposed adjacent ground line 304C. Signal lines 302A-302D and ground lines 304A-304C are all disposed in a common plane. It is to be understood that while four signal lines 302A-302D are shown in FIG. 3A, more or less signal lines 302A-302D may be present. Additionally, it is to be understood that while three ground lines 304A-304C are shown in FIG. 3A, more or less ground lines 304A-304C may be present. In one embodiment, the signal lines 302A-302D are substantially parallel to the ground lines 304A-304C. The ground lines 304A-304C have a width shown by arrows "C". In one embodiment, the signal lines 302A-302D all have the same width. In another embodiment, the ground lines 304A-304C all have the same width. In another embodiment, the ground lines 304A-304C all have the same width as the signal lines 302A-302D.

A grounding structure 306 is also present. The grounding structure 306 is disposed in a separate plane from the signal lines 302A-302D and ground lines 304A-304C. The grounding structure 306 includes a backbone portion 308, and multiple beams 310A-310C. It is to be understood that while three beams 310A-310B are shown, more or less beams 310A-301C may be present. In one embodiment, the number of beams 310A-310C is equal to the number of ground lines 304A-304C. In one embodiment, the beams 301A-310C are all disposed in a common plane and are substantially parallel to one another. The beams 310A-310C have a width shown by arrows "D". In one embodiment, the beams 310A-310C all have the same width. In another embodiment, the beams 310A-310C have the same width as the ground lines 304A-304C. In one embodiment, the beams 310A-310C are shorter in length than the grounding lines 304A-304C.

The grounding structure 306 also includes grounding bars 312A-312C that are coupled between the beams 310A-310C and the grounding lines 304A-304C. The grounding bars 312A-312C have a width shown by arrows "E". In the embodiment shown in FIG. 3A, the grounding bars 312A-312C have a smaller width than the grounding lines 304A-304C.

Figure 3B:
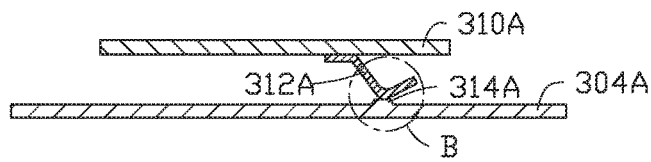
FIG. 3B is a schematic cross sectional illustration taken along line A-A of FIG. 3A.
Figure 3C:
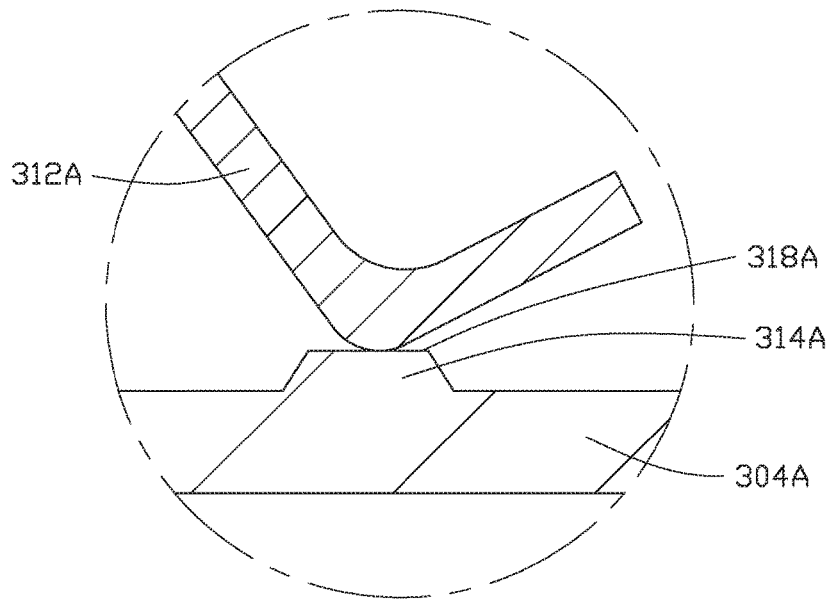
FIG. 3C is a schematic close-up view of FIG. 3B.

FIG. 3B is a schematic cross sectional illustration taken along line A-A of FIG. 3A. As shown in FIG. 3B, the grounding bar 312A connects the beam 310A to the grounding line 304A. Thus, the grounding bar 312A extends between the two planes where the beam 310A and grounding line 304A reside. The grounding line 304A has a contact portion 314A where the grounding bar 312A contacts the grounding line 304A. FIG. 3C is a schematic close-up view of section "B" of FIG. 3B. As shown in FIG. 3C, the grounding bar 312A contacts the contact portion 314A at a location such that the contact area between the contact portion 314A and the grounding bar 312A is less than the entire upper surface 318A of the contact portion 314A.

The signal lines 302A-302D, grounding lines 304A-304C and grounding structure 306 all comprise conductive material. In one embodiment, the conductive material comprises a metal. The grounding structure 306 and grounding lines 304A-304C collectively operate to mitigate crosstalk. The larger the contact area between the grounding bars 312A-312C and the grounding lines 304A-304C, the more the crosstalk is mitigated.

Figure 3D:
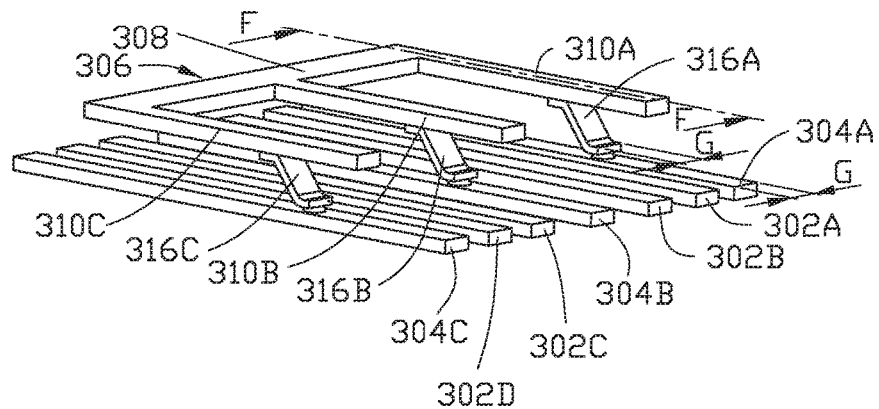
FIG. 3D is a schematic top illustration of a connector device according to one embodiment.
Figure 3E:
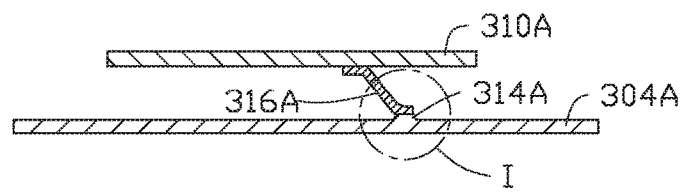
FIG. 3E is a schematic cross sectional illustration taken along line F-F of FIG. 3D according to one embodiment.

FIG. 3D is a schematic top illustration of a connector device 204 according to one embodiment. FIG. 3E is a schematic cross sectional illustration taken along line F-F of FIG. 3D according to one embodiment. The connector device 204 includes grounding bars 316A-316C that each have a width shown by arrows "G". In one embodiment, the width of the grounding bars 316A-316C is substantially equal to the width of the grounding lines 304A-304C. In another embodiment, the grounding bars 316A-316C have a width that is substantially equal to the width of the beams 310A-310C. In another embodiment, the grounding bars 316A-316C all have substantially the same width.

Figure 3F:
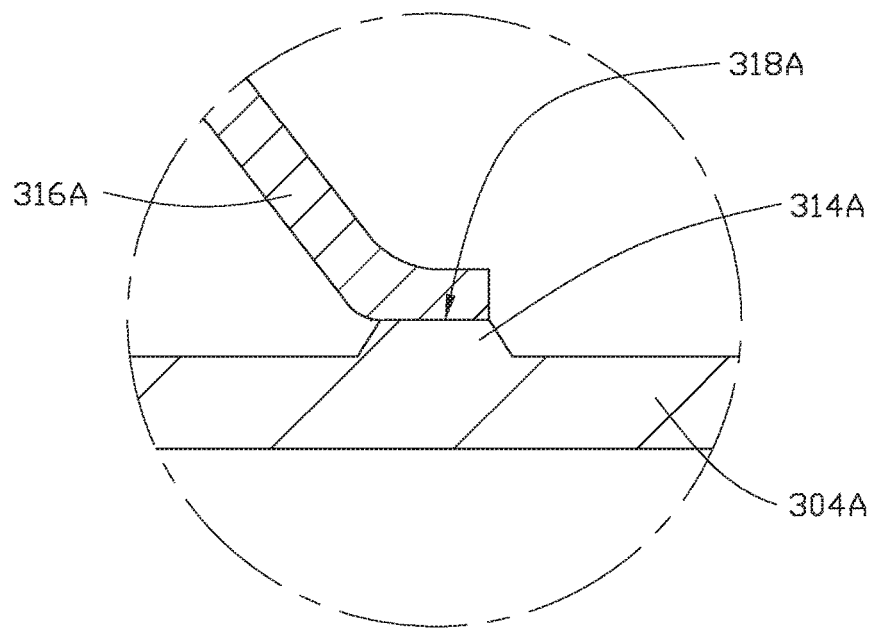
FIG. 3F is a schematic cross sectional illustration taken along line A-A of FIG. 3B according to another embodiment.

FIG. 3F is a schematic close-up view of section "I" of FIG. 3E according to one embodiment. As shown in FIG. 3F, the grounding bar 316A, extends for the entire length of the upper surface 318A of the contact portion 314A to maximize the contact between the grounding bar 314A and the grounding line 304A. In one embodiment, the grounding bar 316A extends for the entire length of the upper surface 318A of the contact portion 314A and also has substantially the same width as the grounding line 304A.

Figure 3G:
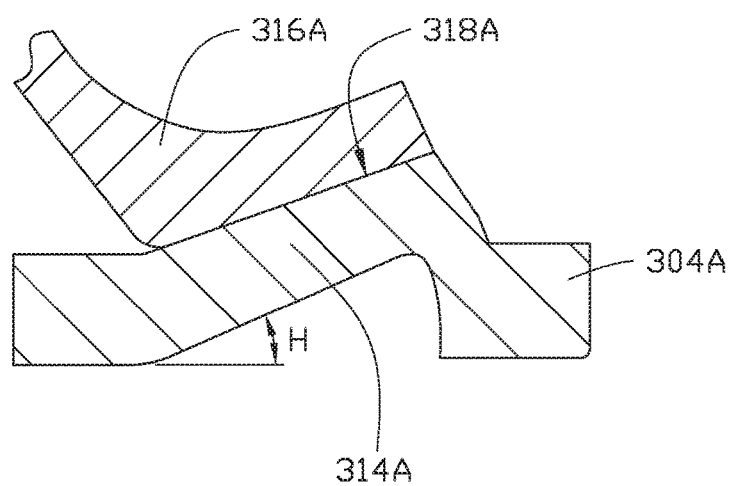
FIG. 3G is a schematic close-up view of FIG. 3E according to another embodiment.

FIG. 3G is a schematic close-up view of FIG. 3E according to another embodiment. As shown in FIG. 3G, the contact portion 314A has a slope so that the contact portion 314A is disposed at an angle "H" relative to the plane in which the grounding line 304A is disposed. Furthermore, the grounding bar 316A is also disposed along a slope. In one embodiment, the slope of the grounding bar 316A is substantially the same as the slope of the contact portion 314A. In one embodiment, the grounding bar 316A extends for the entire length of the upper surface 318A of the contact portion 314A, has substantially the same width as the grounding line 304A and has a slope that matches the slope of the contact portion 314A.

It is contemplated that other arrangements for the connection between the grounding structure 306 and the grounding lines 304A-304C are possible. For example, in one embodiment, the contact portion 314A may be curved in the opposite direction to the grounding bar 316A and the contact surface 318A is shaped to match the contact portion 314A. In another embodiment, the contact portion 314A may be substantially planar and the grounding bar 316A may extend substantially perpendicular to the contact portion 314A. In another embodiment, the base part of the grounding bar 316A may be perpendicular to the grounding bar 304A to replicate an "L" shape. In another embodiment, the contact portion 314A is curved in the direction opposite to the contact portion between the grounding bar 316A, and the contact portion of the grounding bar is shaped to match. The base part of the grounding bar and the upper surface 318A is perpendicular to the grounding line 304A. In another embodiment, each grounding line 304A-304C is sandwiched between two grounding bars 316A-316C. In another embodiment, a hole is disposed through the grounding line 304A-304C and the grounding bar 316A-316C forms a plug that fits into the hole. In another embodiment, the grounding bar 316A-316C has an "E" shape and the three parts that make up the "E" shape are in contact with the grounding line 304A-304C. In still another embodiment, electrically conductive grease, rubber or putty is used between the grounding bar 316A-316 and the upper surface 318A. In another embodiment, a cross-sectional illustration of the grounding bar 316A and grounding line 304A connection at the contact portion 314A has a jagged interface; a tooth and gear interface; and a triangle and groove interface, a semi-circle and groove interface or a semi-elliptical and groove interface where the groove is fitted into either the grounding bar or grounding line.

The benefit of the various embodiments discussed herein is that the contact surface area between the grounding bar and the grounding line is increased so that the crosstalk between the signal lines is greatly reduced or even completely eliminated.

While the foregoing is directed to embodiments of the present disclosure, other and further embodiments of the disclosure may be devised without departing from the basic scope thereof, and the scope thereof is determined by the claims that follow.

What is claimed is:

1. A device, comprising:
   a printed circuit board; and
   a connector structure coupled to the printed circuit board, wherein the connector structure comprises:
      a plurality of signal lines;
      a plurality of ground lines with a raised contact area; and
      a grounding structure coupled to the plurality of ground lines, wherein the grounding structure includes:
         a first beam portion disposed in a separate plane from the plurality of ground lines;
         a second beam portion disposed in the separate plane;
         a backbone portion, wherein the first beam portion and the second beam portion are coupled to the backbone portion; and
         a first ground bar coupled to both the first beam portion and a first ground line of the plurality of ground lines, wherein the first ground line and the first ground bar have a substantially equal width and the first ground bar contacts less than the entire raised contact area.

2. The device of claim 1, wherein the first beam portion and the first ground bar have a substantially equal width.

3. The device of claim 1, wherein the plurality of ground lines further includes a second ground line, the grounding structure further comprising a second ground bar coupled to both the second beam portion and the second ground line, wherein the second ground line and the second ground bar have a substantially equal width.

4. The device of claim 3, wherein the first beam portion and the first ground bar have a substantially equal width.

5. The device of claim 1, wherein the first beam portion has a length that is less than a length of the plurality of ground lines.

6. A device, comprising:
a printed circuit board; and
a connector structure coupled to the printed circuit board, wherein the connector structure comprises:
  a plurality of signal lines;
  a plurality of ground lines with a raised contact area; and
  a grounding structure coupled to the plurality of ground lines, wherein the grounding structure includes:
    a first beam portion disposed in a separate plane from the plurality of ground lines;
    a second beam portion disposed in the separate plane;
    a backbone portion, wherein the first beam portion and the second beam portion are coupled to the backbone portion; and
    a first ground bar coupled to both the first beam portion and a first ground line of the plurality of ground lines, wherein the first ground line comprises a first ground line contact portion, wherein the first ground bar comprises a first ground bar contact portion, and wherein the first ground line contact portion is parallel to the first ground bar contact portion and the first ground bar contacts less than the entire raised contact area.

7. The device of claim 6, wherein the first ground line contact portion has a slope as a measured from a horizontal plane, wherein the first ground bar contact portion has a slope as measured from the horizontal plane, and wherein the first ground line contact portion slope as measured from the horizontal plane and the first ground bar contact portion slope are parallel.

8. The device of claim 7, wherein the first ground bar contact portion has a width equal to a width of the first ground line contact portion.

9. The device of claim 6, wherein the first ground bar contact portion has a width equal to a width of the first ground line contact portion.

10. The device of claim 6, wherein the plurality of ground lines includes a second ground line, the grounding structure further comprising a second ground bar coupled to both the second beam portion and the second ground line, wherein the second ground line comprises a second ground line contact portion, wherein the second ground bar comprises a second ground bar contact portion, and wherein the second ground line contact portion is parallel to the second ground bar contact portion.

11. The device of claim 10, wherein the second ground line and the second ground bar have a substantially equal width.

12. The device of claim 6, wherein the first beam portion has a length that is less than a length of the plurality of ground lines.

13. A connector structure for an electronic device, comprising:
a plurality of signal lines;
a plurality of ground lines with a raised contact area; and
a grounding structure coupled to the plurality of ground lines, wherein the grounding structure includes:
  a first beam portion disposed in a separate plane from the plurality of ground lines;
  a second beam portion disposed in the separate plane;
  a backbone portion, wherein the first beam portion and the second beam portion are coupled to the backbone portion; and
  a first ground bar coupled to both the first beam portion and a first ground line of the plurality of ground lines, wherein the first ground line and the first ground bar have a substantially equal width and the first ground bar contacts less than the entire raised contact area.

14. The connector structure of claim 13, wherein the first beam portion and the first ground bar have a substantially equal width.

15. The connector structure of claim 13, wherein the plurality of ground lines includes a second ground line, the grounding structure further comprising a second ground bar coupled to both the second beam portion and the second ground line, wherein the second ground line and the second ground bar have a substantially equal width.

16. The connector structure of claim 15, wherein the first beam portion and the first ground bar have a substantially equal width.

17. The connector structure of claim 13, wherein the first beam portion has a length that is less than a length of the plurality of ground lines.

18. A connector structure, comprising:
a plurality of signal lines;
a plurality of ground lines with a raised contact area; and
a grounding structure coupled to the plurality of ground lines, wherein the grounding structure includes:
  a first beam portion disposed in a separate plane from the plurality of ground lines;
  a second beam portion disposed in the separate plane;
  a backbone portion, wherein the first beam portion and the second beam portion are coupled to the backbone portion; and
  a first ground bar coupled to both the first beam portion and a first ground line of the plurality of ground lines, wherein the first ground line comprises a first ground line contact portion, wherein the first ground bar comprises a first ground bar contact portion, and wherein the first ground line contact portion is parallel to the first ground bar contact portion and the first ground bar contacts less than the entire raised contact area.

19. The connector structure of claim 18, wherein the first ground line contact portion has a slope as measured from a horizontal plane, wherein the first ground bar contact portion has a slope as measured from the horizontal plane, and wherein the first ground line contact portion slope as measured from the horizontal plane, and the first ground bar contact portion slope are parallel.

20. The connector structure of claim 19, wherein the first ground bar contact portion has a width equal to a width of the first ground line contact portion.

21. The connector structure of claim 18, wherein the first ground bar contact portion has a width equal to a width of the first ground line contact portion.

22. The connector structure of claim 18, wherein the plurality of ground lines includes a second ground line, the grounding structure further comprising a second ground bar coupled to both the second beam portion and the second ground line, wherein the second ground line has a second ground line contact portion, wherein the second ground bar has a second ground bar contact portion, and wherein the second ground line contact portion is parallel to the second ground bar contact portion.

23. The connector structure of claim 22, wherein the second ground line and the second ground bar have a substantially equal width.

24. The connector structure of claim 22, wherein the first beam portion has a length that is less than a length of the plurality of ground lines.

\* \* \* \* \*